United States Patent
Fiekowsky

(10) Patent No.: US 6,760,473 B1
(45) Date of Patent: Jul. 6, 2004

(54) OPTICAL PROXIMITY CORRECTION SERIF MEASUREMENT TECHNIQUE

(75) Inventor: Peter J. Fiekowsky, Los Altos, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 776 days.

(21) Appl. No.: 09/685,973

(22) Filed: Oct. 10, 2000

Related U.S. Application Data

(60) Provisional application No. 60/218,078, filed on Jul. 12, 2000.

(51) Int. Cl.[7] .................................................. G06K 9/00
(52) U.S. Cl. .................. 382/149; 250/559.22; 382/199; 382/286; 382/288
(58) Field of Search ................................ 382/149, 286, 382/145, 144, 199, 288; 356/237.2, 237.3, 237.4, 237.5, 613; 250/559.35, 559.36, 559.4, 559.41, 559.42, 559.43, 559.45, 559.22, 548; 348/126; 438/16; 702/95, 159, 121, 172, 702, 157

(56) References Cited

U.S. PATENT DOCUMENTS

| 5,294,803 A | 3/1994 | Pahr |
| 5,477,332 A | 12/1995 | Stone et al. |
| 5,614,990 A | 3/1997 | Bruce et al. |

(List continued on next page.)

OTHER PUBLICATIONS

Peter J. Fiekosky, Quotation (Preliminary), Oct. 17, 1994; KLA219 "Photomask Defect Inspection System (Phototype System)".

Nicholas Doe; Richard Eandi; Optical Proximity Effects in Sub–Micron Photomask CD Meterology; Advanced Imaging Systems, Zygo Corp.

George et al., "A Practical and Precise Method for Mask Defect Size Measurement", Mar. 10, 1996, Proceedings of the SPIE Conference on Photo–lithography.

(List continued on next page.)

Primary Examiner—Timothy M. Johnson
Assistant Examiner—Ali Bayat
(74) Attorney, Agent, or Firm—Beyer Weaver & Thomas LLP

(57) ABSTRACT

An OPC feature measurement technique accurately measures serif area of OPC features, feature separation and line symmetry, and is especially useful for measuring dimensions which are less than about the wavelength of the examining radiation. The relative area of serifs present on a line end is measured by first defining a region of interest around the line end and then an intensity profile is created. The differences between data points on the profile and a constant value are summed in order to calculate a flux value. The flux value is divided by the intensity range to determine an area. The separation distance between a line end and another feature is determined by first defining a region of interest that spans the separation distance between the two features. Next, an intensity profile is created. The differences between data points on the profile and a constant value are summed to calculate a flux value. The separation distance between the features is calculated from the flux value. The asymmetry of serifs of a line present on a photomask is determined by first defining two regions of interest: a shank region of interest that includes the shank of the line and an end region of interest that includes the end of the line. Intensity profiles are created for both regions of interest. The profiles are created by summing values in a longitudinal direction with respect to the line. Finally, an asymmetry area value for the serifs is calculated using the end intensity profile and a centroid of the shank region of interest. The effective diameter, the separation distance and the asymmetry area are useful for evaluating the quality of the photomask.

17 Claims, 12 Drawing Sheets

U.S. PATENT DOCUMENTS

| | | | |
|---|---|---|---|
| 5,633,735 | A | 5/1997 | Hunter, Jr. et al. |
| 5,804,336 | A | 9/1998 | Rolfon |
| 5,862,058 | A | 1/1999 | Samuels et al. |
| 5,966,677 | A | 10/1999 | Fiekowsky |
| 5,994,711 | A | 11/1999 | Seachman et al. |
| 6,127,071 | A | 10/2000 | Lu |
| 6,167,355 | A | 12/2000 | Fiekowsky |
| 6,178,360 | B1 | 1/2001 | Pierrat et al. |
| 6,181,474 | B1 | 1/2001 | Ouderkirk et al. |
| 6,263,292 | B1 | 7/2001 | Fiekowsky |
| 6,271,535 | B1 | 8/2001 | Seachman et al. |
| 6,397,165 | B1 | 5/2002 | Fiekowsky |
| 6,405,153 | B1 | 6/2002 | Fiekowsky |
| 6,421,820 | B1 * | 7/2002 | Mansfield et al. ............ 716/21 |

OTHER PUBLICATIONS

Stocker, et al., "Characterisation of Defect Sizing on An automatic Inspection Station" (KLA238e), 1993, SPIE vol. 2087 Photomask Technology and Management.

Kawahira, et al., Semi Standards Programmed Defect masks and Its Applications for Defect Inspection, SEMI Japan Standards Committee.

Peter J. Fiekowsky, Quotation (Preliminary), Oct. 17, 1994.

Fiekowsky et al., "Defet Printability Measurement on the KLA–351: Correlation to Defect Sizing Using the AVI Metrology System", SPIE $19^{th}$ Annual BACUS Symposium on Photomask Technology and Management Conference 3873, Sep. 1999.

Tran et al., "Application of Image processing Software to Characterize the Photomask Key Parameters for Future Technologies," Apr. 17–18, 1997, Proceedings of SPIE vol. 3096.

* cited by examiner

Design  Mask  Wafer

Design  Mask  Wafer

Design  Mask  Wafer

Intensity Profile

Intensity Profile

Intensity Profiles

End Profile

OPTICAL PROXIMITY CORRECTION SERIF MEASUREMENT TECHNIQUE

This application claims priority of U.S. provisional patent application No. 60/218,078, filed Jul. 12, 2000 entitled "Optical Proximity Correction Serif Measurement Technique," which is hereby incorporated by reference.

This application is related to U.S. Pat. No. 5,966,677 issued on Oct. 12, 1999 entitled "High Accuracy Particle Dimension Measurement System," to U.S. patent application Ser. No. 09/657,920 filed on Sep. 8, 2000 entitled "Microscopic Feature Dimension Measurement System," to U.S. patent application Ser. No. 09/342,526 filed on Jun. 29, 1999 entitled "High Accuracy Particle Dimension Measurement System," to U.S. patent application Ser. No. 09/606,841 filed on Jun. 28, 2000 entitled "Microscopic Feature Opacity Measurement System," and to U.S. patent application Ser. No. 09/028,207 filed on Feb. 23, 1998 entitled "High Accuracy Particle Dimension Measurement System," which are all incorporated by reference.

FIELD OF THE INVENTION

The present invention relates generally to optical measurement systems. More specifically, the present invention relates to the measurement of features in semiconductor manufacturing.

BACKGROUND OF THE INVENTION

The successful manufacture of advanced sub-micron sized semiconductor devices requires the detection, measurement and evaluation of defects and other features as small as 1 micron on the photographic mask (photomask) used to pattern the wafer. Feature inspection and measurement techniques for masks therefore play an important role in mask making and quality assurance.

Thus, it is becoming increasingly important to be able to identify and to correctly size mask defects, line widths, and other features that are under 1 micron in size. Accurate sizing of these features allows masks that are below specification to be repaired and prevents the needless and costly hold up of masks that do meet specification. One of the problems of assessing reticle quality at these sub-micron levels on an automatic inspection system, however, is that the size of these features cannot always be accurately, quickly and cost-effectively measured in a production environment.

It has long been known that mask inspection tools are not measurement tools and that the size information provided by these tools has limited value. Consequently, many mask makers have incorporated measurement aids at the inspection station or move the mask to a more suitable measurement tool in order to make classification decisions. Measurement aids used at the inspection station include calipers, grids, and software based video image markers such as gates, scales, grids, boxes and circles. These aids are fairly rapid, but ultimately require the operator to "eyeball" the boundaries of the defect. This activity is very subjective and can lead to an error in the measurement of the defect.

For example, feature size is often measured by measuring the distance between opposite edges of the feature. Once a feature is identified by an inspection machine, the operator uses a video microscope and a television camera to position a cursor on one side of the feature and another cursor on the other side of the feature. The operator must judge for himself the exact boundaries of the feature and must place the cursors where he sees fit. At this point, the operator pushes a button and the software blindly computes the distance between the two cursors in order to supply a rough approximation of the dimension of the feature. This measurement technique is operator dependent in that the operator must manually position the cursors on the boundaries of what the operator believes to be the feature. The operator may misjudge the type of a feature, its boundaries, or may simply misplace a cursor even if the feature is visible. The software then calculates the distance between the cursors, without regard for the type of feature, its true boundaries, etc. The above technique may be performed with a standard video microscope but is completely subject to the operator's skill level and interpretation.

Alternatively, the mask may be removed from the automatic inspection tool and relocated on a more precise and repeatable measurement tool. However, this approach involves removing the mask from production, relocating the feature, and is thus impractical in a production environment. This technique is also costly, time-consuming and increases the handling risk. For example, an atomic force microscope (AFM) may be used to measure feature sizes; such a microscope is extremely accurate but is very slow, very expensive and is still subject to operator interpretation.

Another difficulty with light measurements of features less than 1 micron in size is that the wavelength of photons begins to interfere with the measurement of these 1 micron and less feature sizes. Many techniques do not adequately address the non-linearities associated with such measurements.

One approach that has been taken that uses calibration of an automatic inspection system in order to size defects is described in *Characterization Of Defect Sizing On An Automatic Inspection Station,* D. Stocker, B. Martin and J. Browne, Photomask Technology and Management (1993). One disadvantage with the approach taken in this paper is that it only provides a technique for measurement of defects of 1.5 microns and greater. Such sizes of defects would produce a linear relationship between reference sizes and actual measured sizes, and the paper does not account for defects less than 1 micron that would produce a non-linear relationship.

Of particular concern is the measurement of features used in Optical Proximity Correction (OPC). In general, photomasks are used to generate a desired pattern on silicon wafers using optical projection lithography. The optical projection causes blurring of the image created on the wafer surface. This blurring is especially noticeable on corners, and on edges near corners.

FIG. 1 illustrates the blurring effect on a corner during lithography. Design 10 represents a pattern for a silicon wafer that has a sharp corner. This design has been produced in a suitable computer program and is represented in a design database and is viewed by a user on a computer screen. Due to blurring during the process, mask 12 ends up having a slightly more rounded corner then the sharp corner in the design. When the mask is eventually used to produce wafer 14, the resultant corner is much more rounded, and is substantially different from the sharp corner desired in the original design.

FIG. 2 illustrates the blurring effect for the pattern of two line ends. Lines 20 and 22 in the original design are desired to be a certain distance apart. Due to blurring, lines 24 and 25 on the mask have more rounded ends and are slightly farther apart. The resultant wafer shows lines 26 and 27 having markedly rounded ends and being further apart then desired in the original design.

The OPC technique has been developed in order to correct for the detrimental affects of blurring in lithography. In most cases OPC corrections consist of "serifs" added to corners on the photomask. These serifs add or remove chrome at the mask corners in order to compensate for the area lost due to blurring. There is a large amount of literature dealing with the design of these OPC features. OPC features have become vital to the success of microlithography over the last few years. As chip geometries continue to shrink they will become yet more critical. Despite their widespread use, it has been very difficult to measure OPC features (called "serifs") because their sizes are small, and by nature they appear as curves on masks and wafers. Conventional metrology tools are designed to measure the distance between edges. If the edges are irregular curves, as serifs are, edge-to-edge measurement becomes difficult, user dependent and sample dependent. Accurate measurement of these serifs as printed on photomasks (and then on wafers) is essential to the development of improved OPC algorithms and production processes.

FIG. 3 illustrates correction using Optical Proximity Correction (OPC). Using OPC, an additional shape 32 (termed a serif) is added to the corner of design 30. The resultant mask 34 from design 30 now includes a serif 36 which is more rounded in shape. Finally, the resultant wafer 38 has a fairly sharp corner which is the desired shape for the patent on the wafer.

FIG. 4 illustrates correction of blurring for two line ends using OPC. In the original design lines 40 and 42 are spaced a desirable distance apart and have serifs 41–44 added to each corner of each line ends. Line ends 46 and 47 on the mask produced from the design shows each line having more rounded serifs and the ends being slightly closer than desired. Finally, the resultant wafer shows a pattern of two line ends 48 and 49 having ever so slightly rounded corners and having the desired spacing between the two line ends.

One problem associated with OPC is that the added serifs may not be of the correct size. Serifs added to corners of a pattern may be either too large or too small, while serifs added to adjacent line ends may produce bridging (if the serifs are too large), or may produce line shortening (if the serifs are too small).

As with all manufacturing processes, variations from the design frequently occur. Some of those variations will cause a wafer produced from the photomask to fail. Photomask manufacturers need a method of measuring features in order to predict consistently which features will cause failures and which will not. This is especially needed for OPC features because the reason these features (usually serifs) are included in the mask design is because the position of the edge projected onto the wafer is critical at these positions.

As described above, the traditional method of measuring mask features, including OPC features, has been to measure the edge-to-edge size of features. This method becomes inaccurate when the size of the feature being measured approaches or becomes less than the wavelength of the light used to produce the image. In addition to becoming inaccurate, it also becomes noisy because the edge contrast diminishes with smaller features, thus any noise in the image will cause larger uncertainties in the edge position. Edge determination becomes more difficult when measuring OPC features because the edges are curved, thus it is important to measure the edge position carefully to get a meaningful measurement. A convenient technique to accurately measure OPC features at these small dimensions would be desirable.

SUMMARY OF THE INVENTION

To achieve the foregoing, and in accordance with the purpose of the present invention, an OPC feature measurement technique is disclosed that accurately measures serif area of OPC features, feature separation and line symmetry.

The flux-area measurement technique discussed in U.S. Pat. No. 5,966,677 has been shown to be accurate and consistent in predicting the size of defects and features printed onto wafers. The present invention discloses techniques for using flux-area measurement methods for measuring the relevant parameters of OPC features. The flux-area technique measures the parameter that affects printability, that is the amount of light flux that passes through a region of the mask and thus is available to activate the lithographic process. These measurements do not attempt to measure edge positions, thus they suffer from lower noise and less ambiguity due to edge curvature. Furthermore, because the flux-area technique measures light absorbed (or reflected), its measurements correctly reflect the presence of thin chrome, soft (dirt) defects, defects smaller than the resolution of the optical system and other features having ambiguous edges.

The effective area of a serif can be determined by measuring the area of defined regions of the feature, and then comparing these areas either to similar printed features, or to features simulated by extrapolating straight lines in the feature to be measured. Straight edges can be defined by a threshold value or by their intensity profile. The embodiments described herein are especially useful for measuring curved regions having a radius of less than about twice the wavelength (lambda) of the examining radiation, and for measuring distances between similarly curved features.

In a first embodiment, the relative area of serifs present on a line end is measured. A region of interest is defined around the line end and an intensity profile parallel to the line is created. The differences between the profile intensities in the serif area and a constant value (e.g., the average profile intensity on the shank of the line) are summed in order to calculate a serif area flux value. The flux value is divided by the intensity range to determine an area, which can then be converted into an effective diameter of a corresponding spot or hole. The effective diameter is used to quantify the total area of the OPC serifs.

In a second embodiment, the separation distance between a line end and another feature is determined. First, a region of interest that spans the separation distance between the two features is defined. Next, an intensity profile is created orthogonal to the line direction. The differences between data points on the profile and a constant value are summed to calculate a separation area flux value. The separation distance between the features is calculated from the separation area flux value and the height of the region of interest. The separation distance is useful for evaluating the quality of the photomask.

In a third embodiment, the asymmetry of serifs on a line end present on a photomask is determined. Two regions of interest are defined: a shank region of interest that includes the shank of the line and an end region of interest that includes the end of the line. Intensity profiles are created for both regions of interest. The profiles are created by summing values in a longitudinal direction with respect to the line. Finally, an asymmetry offset value for the serifs is calculated using the centroid of the end intensity profile and the centroid of the shank region profile. The asymmetry offset is useful for evaluating the quality of the photomask.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

As discussed earlier, it is important to be able to measure dimensions associated with serifs on photomasks used to produce semiconductor wafers. Serifs are also known as "dog ears" and "hammer heads." The below description relates to measurement of serifs in particular, although measurement of other similar features is contemplated.

Further, the below description is applicable to a wide variety of situations. In the below examples, OPC measurements are performed using visible light and I-line illumination taking images from various KLA300 inspection systems and KMS metrology systems. Mask measurement data is compared with SEM measurements of the mask and the wafer. Results show that optical measurements made using the techniques described herein correlate two to three times better to printed feature size than conventional SEM measurements of the mask, and four to five times better than conventional optical measurements.

Figure 1:
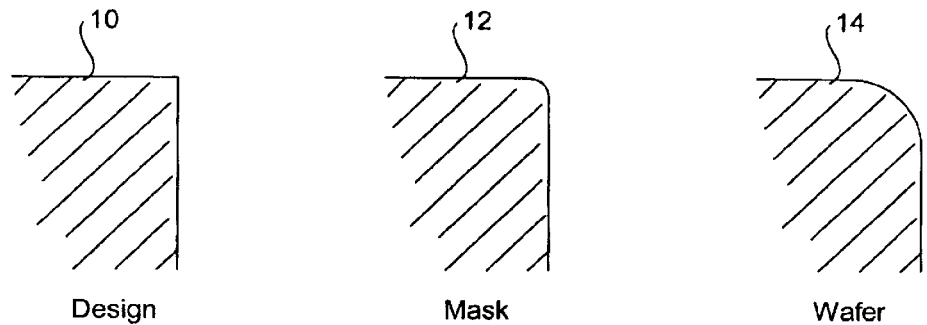
FIG. 1 illustrates the blurring effect on a corner during lithography.
Figure 2:
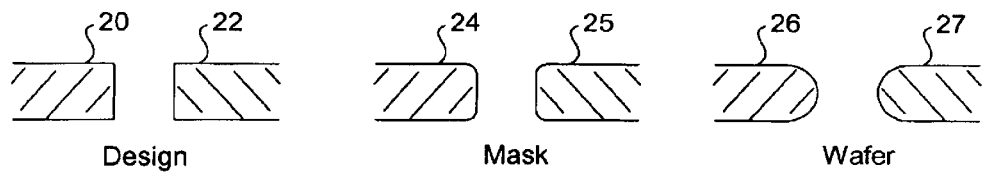
FIG. 2 illustrates the blurring effect for the pattern of two line ends.
Figure 3:
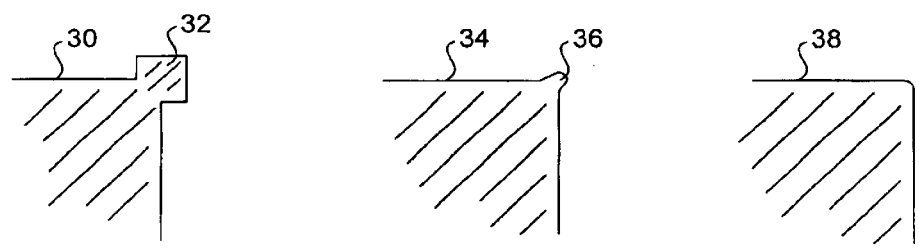
FIG. 3 illustrates correction using Optical Proximity Correction (OPC).
Figure 4:
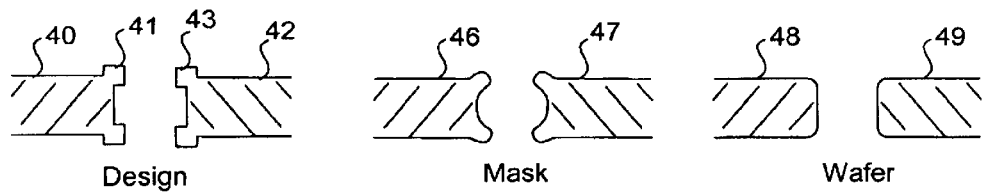
FIG. 4 illustrates correction of blurring for two line ends using OPC.

The effective size of the isolated corner serifs shown in FIG. 3 can be measured by using the flux area corner radius technique described in U.S. patent application Ser. No. 09/028,207 referenced above. As mentioned earlier, line ends are critical features that also receive OPC. Typically, each corner of a line end receives a serif. A defect on one of the serifs can cause the line to extend too far, possibly bridging to a nearby line or to another line end. A defect can also cause the line to be too short, possibly not completing a circuit or changing the parameters of a device. In certain situations, the line could also be displaced from side to side. Bridging and line shortening can be predicted by two measurements: the "serif area," the extra chrome area above that which a non-corrected line end would have, and the separation between the line end and an adjacent feature (such as another line). A line symmetry measurement is used to measure the displacement of the line from side to side. Each of these techniques will be discussed in turn.

Serif Area Measurement Technique

Figure 5:
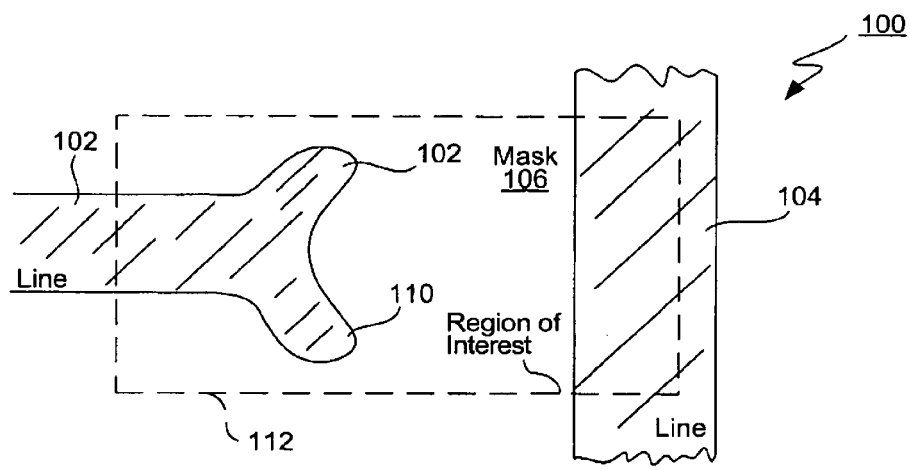
FIG. 5 illustrates a line in proximity to another feature.

FIG. 5 illustrates a line 102 in proximity to another feature 104. In this example, lines 102 and 104 are clear regions present upon a chrome mask 106 and it is desirable to have an optimal distance between the two and to have an optimal size for serifs 108 and 110. Region of interest 112 identifies the region on the mask to be analyzed.

Figure 6:
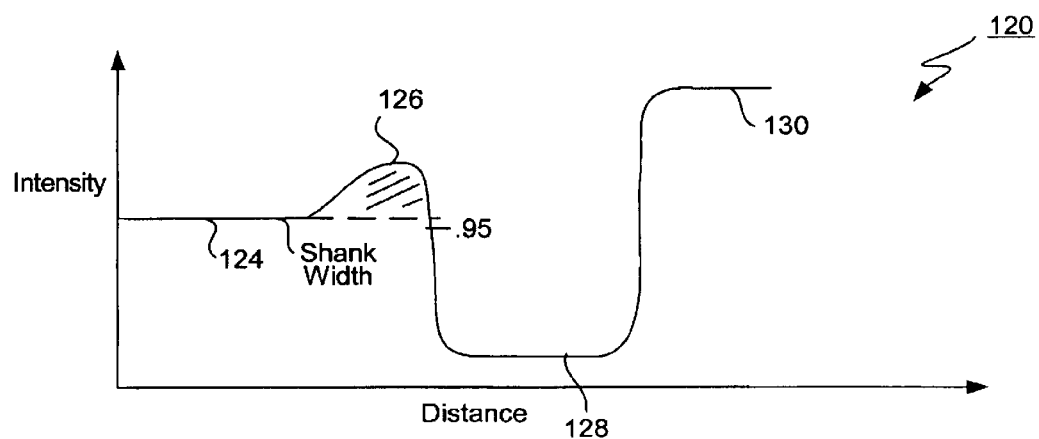
FIG. 6 is an inverted intensity profile for the region of interest of FIG. 5.
Figure 7:
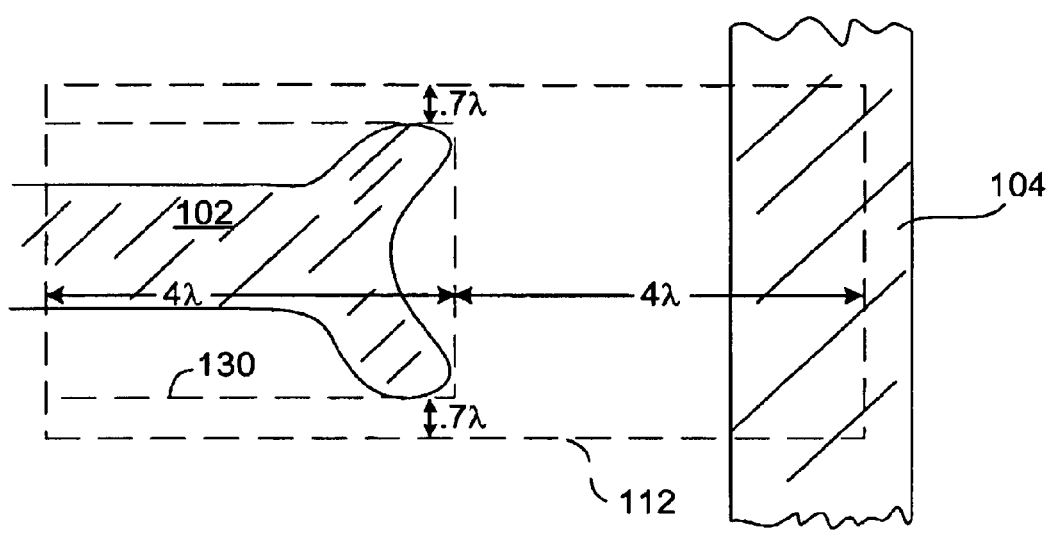
FIG. 7 illustrates a bounding box used in conjunction with lines of FIG. 5.

FIG. 6 is an intensity profile 120 for the region of interest of FIG. 5. Profile 120 has a constant "shank" intensity value 124 where just line 102 is present but exhibits a serif area 126 which represents the additional light intensity due to serifs 108 and 110. Profile 120 drops down to a minimal value 128 in-between line 102 and line 104 where just chrome is present, and then jumps to a high constant value 130 representing the region where clear line 104 is present. FIGS. 5 and 6 illustrate an example in which the mask is chrome and clear regions of the mask represent features; the intensity profile is determined using transmitted light. Of course, chrome lines on a clear mask may be used, and/or different types of illumination may also be used; the following techniques will be understood by one of skill in the art for any of these variations. FIG. 7 illustrates a bounding box 130 used in conjunction with lines 102 and 104 of FIG. 5.

In a nutshell, the serif area is measured by comparing the flux of the "shank" of the line (value 124) to the flux at the end of the line as shown in FIGS. 5 and 6. The result is given as an area converted to an "effective diameter." The effective diameter is the diameter of a chrome spot or hole that would block or transmit the same light as the measured area.

Figure 8:
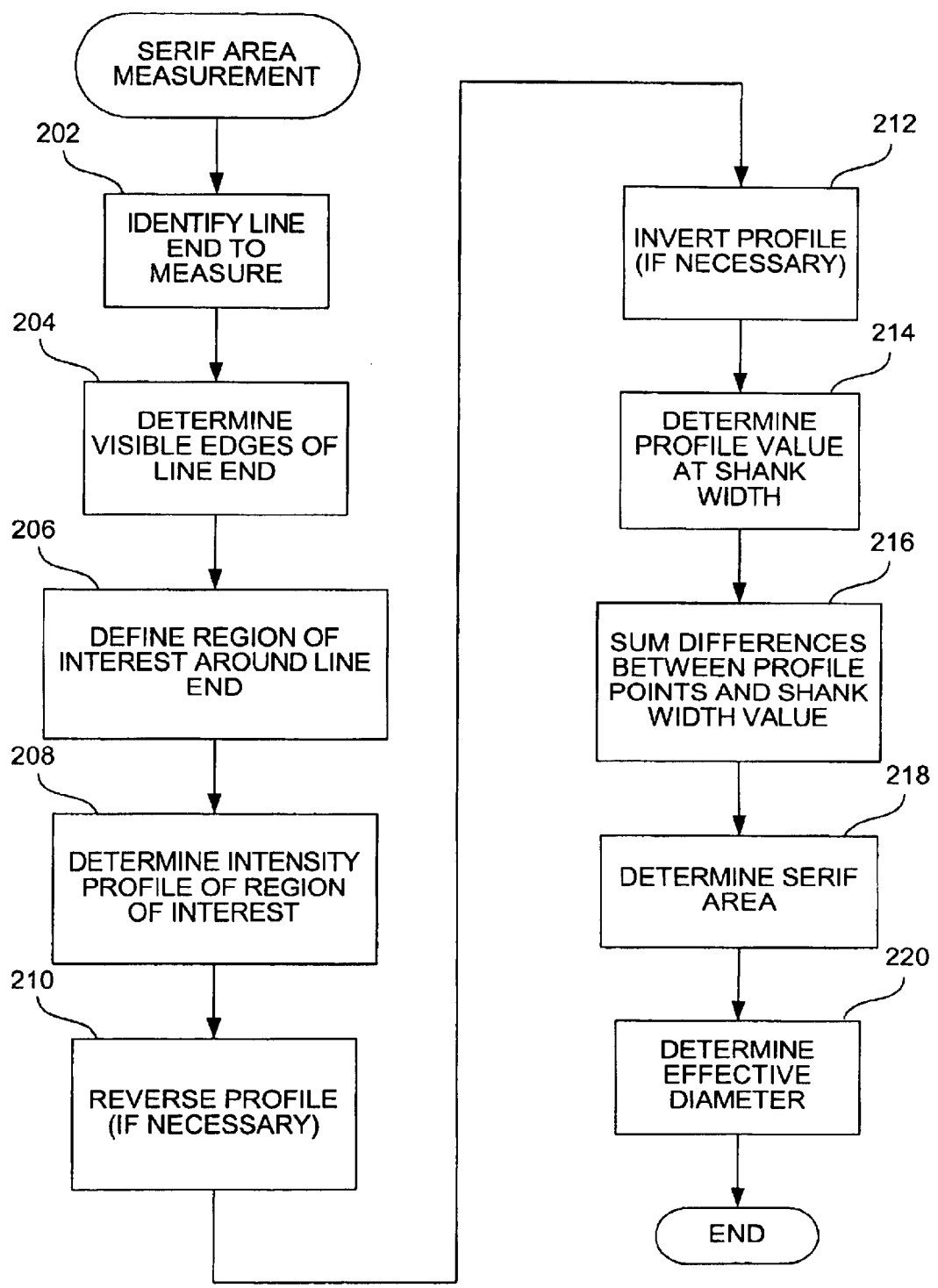
FIG. 8 is a flow diagram describing a serif area measurement technique according to one embodiment of the invention.

FIG. 8 is a flow diagram describing a serif area measurement technique according to one embodiment of the invention. In step 202 a line end to measure is identified. Typically, this may be performed as is known in the art. An operator using a computer system selects a region of a photomask that includes a line end having serifs to be measured. Preferably, video inspection machine 832 is used to identify a particular line on a mask whose OPC features are to be measured. In one embodiment, system 830 automatically identifies a line to be measured as part of the mask production process. In another embodiment, a line to be measured may be identified manually by the operator. Once a feature is identified the inspection machine enters review mode and the video image of the feature site may be displayed on the monitor of the computer.

In step 204 the visible edges of the line end are determined. Preferable, a technique such as blob analysis is used to find the three visible edges of the line end. The result of step 204 is a bounding box that tightly encompasses the line end to be measured. For example, FIG. 7 illustrates a bounding box 130 that has been determined for line 102 in step 204. Next, in step 206 a region of interest 112 is defined around the line end that encompasses the bounding box. The region of interest may be of any suitable size that encompasses the feature of interest. Preferably, region of interest extends four (4) lambda (lambda is the wavelength of the examining radiation) horizontally in either direction from the end of the bounding box as shown in FIG. 7. Also preferably, the region of interest extends approximately 0.7 lambda in each of the vertical directions from the horizontal edge of the bounding box. Such a region of interest 112 is shown in FIG. 7. A distance of four lambda is used in the horizontal direction which is typical in current OPC designs on photomasks and their (UV light) inspection systems. A distance of 0.7 lambda is used in the vertical direction for the same reason. These typical values may change as OPC designs and inspection wavelengths change.

In step 208 an intensity profile is determined for the region of interest that surrounds the lines in question. An intensity profile 120 for the region shown in FIG. 5 is illustrated in FIG. 6. Preferably, the intensity profile is determined as explained in U.S. Pat. No. 5,966,677 referenced above. Depending upon whether clear lines exist upon a chrome mask, whether chrome lines exist upon a clear mask or whether the order of lines is reversed, the intensity profile will have a certain polarity and orientation. For example, the profile of FIG. 6 is appropriate for a clear line on a chrome mask where the line of interest appears on the left and the adjacent feature appears to the right. This case is chosen because the profile is easy to interpret.

Although optional, it is preferable to manipulate other profile types so that they all have the same polarity and orientation such as shown in FIG. 6. It is preferable for the profile to have the shank on the left and an increasing serif area displayed as increasing profile values. Although not required, such orientation facilitates the below discussion and applies to line ends that appear in any direction either clear or opaque. For example, in step 210 the profile may be reversed in order to place the line of interest profile values on the left and the adjacent feature (such as a line) profile values on the right. In step 212 the profile may be inverted; this step is used in a case where there is a chrome line on a clear mask.

In step 214 the constant value of the intensity profile is determined for the shank width. The profile height in region 124 is referred to as the shank width as it corresponds to the shank of line 102. This value will be used as a reference point in determining the total flux of region 126.

In step 216 the differences between the profile points along the profile and the shank width value are summed together in order to produce a flux value termed the serif flux. Although the differences may be calculated in different ways, preferably, for each profile data point on intensity profile 120 until the profile intensity goes below 0.95 times the shank width, the differences between each profile point and the shank width value are summed together to produce the serif flux. Although other values may be used, the data point 0.95 is used because it assures that noise on the shank will not stop the summation. The resulting value from the sum of all these differences is a value in flux and is termed the serif flux and corresponds to the increase in flux produced by serifs 108 and 110. In step 218 the serif area of region 126 is determined by dividing the serif flux by the intensity range. Determination of the intensity range for profile 130 is a technique known to those of skill in the art and is also described in U.S. Pat. No. 5,966,677 referenced above.

Next, in step 220 this area value is converted to an effective diameter of a chrome spot or hole that would have an area equivalent to the serif area. This effective diameter value may then be used as a reference point or as a comparison to other similar features. The result of this comparison will then indicate to the operator a relative size of both serifs that have been added to line 102. This indication of size may then be used to judge whether the size of the serifs is either too large or too small, which would indicate whether bridging or line shortening might occur in the resultant wafer.

Feature Separation Measurement

This technique measures the separation between two features in order to determine the likelihood of bridging and/or line shortening. In the following example, a separation distance is measured between the end of a line and another adjacent line (or other feature). Because potential bridging is likely to occur at the center of the line, a narrow region of interest is located through the center of a line and spans the gap to the adjacent feature. The separation flux is measured by summing the light flux in the band between the two features which is then used to determine the separation distance.

Figure 9:
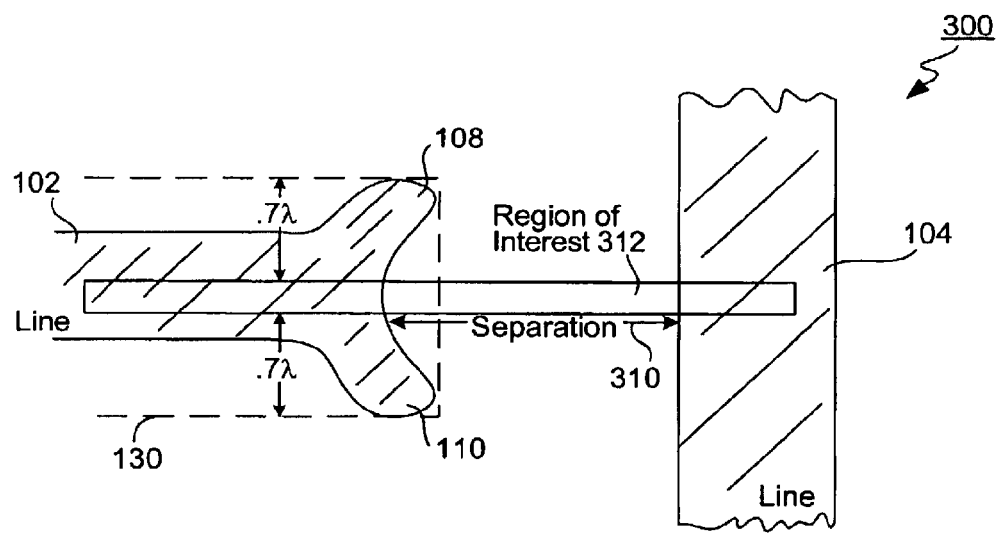
FIG. 9 illustrates a technique for measuring the separation distance between a line and another feature.

FIG. 9 illustrates a technique for measuring the separation distance between a line and another feature. In this example, present on a photomask are lines 102 and 104. Line 102 has serifs 108 and 110. The separation distance 310 between the two lines is measured through the use of region of interest 312.

Figure 10:
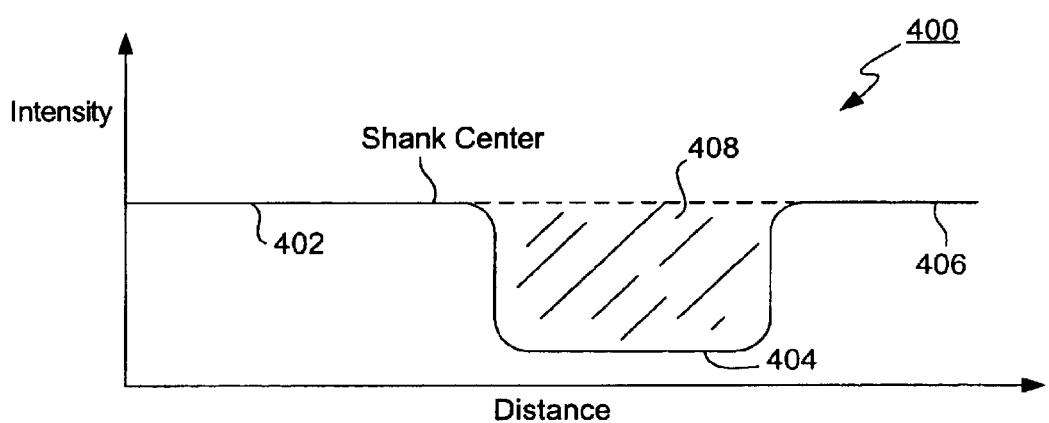
FIG. 10 is an intensity profile taken across the region of interest of FIG. 9.

FIG. 10 is an intensity profile 400 taken across the region of interest of FIG. 9. Profile 400 has an intensity value 402 at the center of the shank which drops off to a low value 404 between the two features and again rises to a high value 406 for the region contained within line 104. In this example, both lines are clear and are present upon a chrome photomask although a negative image may also be present in which case the intensity profile would be inverted.

Figure 11:
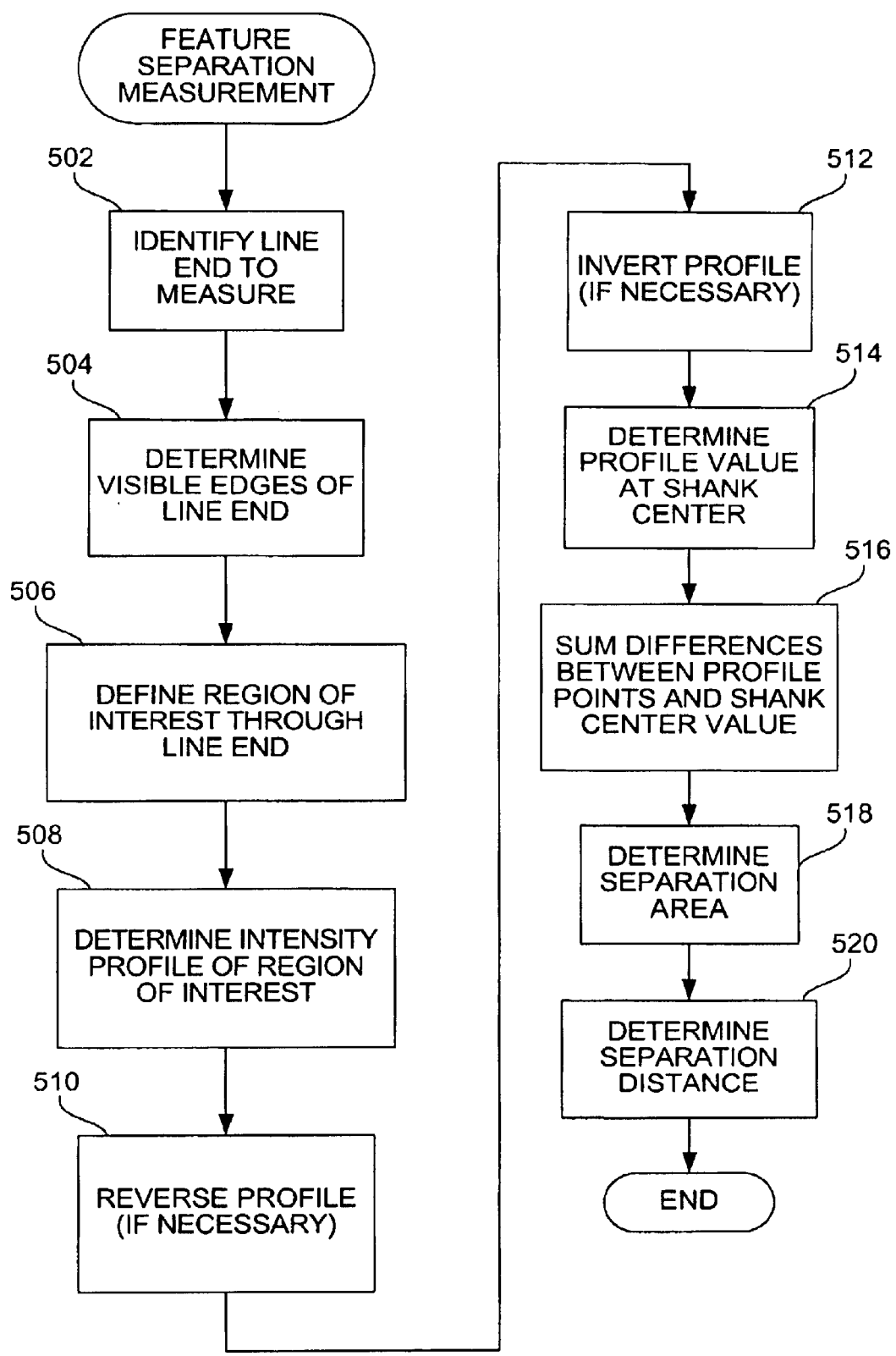
FIG. 11 is a flow diagram describing a feature separation measurement technique according to one embodiment of the invention.

FIG. 11 is a flow diagram describing a feature separation measurement technique according to one embodiment of the invention. In step 502 a line end and adjacent feature to be measured is identified. Typically, this may be performed as is known in the art. An operator using a computer system selects a region of a photomask that includes a line end and adjacent feature. Preferably, video inspection machine 832 is used to identify a particular region on a mask to be measured. In one embodiment, system 830 automatically identifies a line to be measured as part of the mask production process. In another embodiment, a line to be measured may be identified manually by the operator. Once a feature is identified the inspection machine enters review mode and the video image of the feature site may be displayed on the monitor of the computer.

In step 504 the visible edges of the line end are determined. Preferable, a technique such as blob analysis is used to find the three visible edges of the line end. The result of step 504 is a bounding box that tightly encompasses the line end to be measured. For example, FIG. 9 illustrates a bounding box 130 that has been determined for line 102 in step 504.

In step 506 a region of interest 312 is defined through the line end 102 and into line 104 as shown in FIG. 9. Preferably, region of interest 312 is a relatively narrow band located at the center of the line as any potential bridging would occur at the center of the line. In addition, as lines are typically only slightly wider then the wavelength of light used for imaging, a wider region of interest might include blurring from the edges of the line thus confusing the flux baseline measurement. Most preferably, the region of interest 312 is fully contained within line 102. Further, the length of the region of interest is as shown in FIG. 7 in that the region of interest extends out four (4) lambda in each of the horizontal directions from the right edge of bounding box 130 in contact with serifs 108 and 110. The height of the region of interest is determined by measuring down 0.7 lambda from the top edge of bounding box 130 and by measuring up 0.7 lambda from the bottom edge of the bounding box. The space in-between determines the height of the region of interest. Preferably, this height is at least one pixel tall.

In step 508 an intensity profile is determined for the region of interest that crosses the lines in question. An intensity profile 400 for the region shown in FIG. 9 is illustrated in FIG. 10. Preferably, the intensity profile is determined as explained in U.S. Pat. No. 5,966,677 referenced above. Depending upon whether clear lines exist upon a chrome mask, whether chrome lines exist upon a clear mask or whether the order of lines is reversed, the intensity profile will have a certain polarity and orientation. For example, the profile of FIG. 10 is appropriate for a clear line on a chrome mask where the line of interest appears on the left and the adjacent feature appears to the right.

Although optional, it is preferable to manipulate other profile types so that they all have the same polarity and orientation such as shown in FIG. 10. It is preferable for the profile to have the shank on the left and an increasing separation area displayed as increasing profile values. Although not required, such orientation facilitates the below discussion and applies to line ends that appear in any direction either clear or opaque. For example, in step 510 the profile may be reversed in order to place the line of interest profile values on the left and the adjacent feature (such as a line) profile values on the right. In step 512 the profile may be inverted; this step is used in a case where there is a chrome line on a clear mask.

In step 514 the constant value of the intensity profile is determined for the shank center. The profile height in region 402 is referred to as the shank center as it corresponds to the center of the shank of line 102. This value will be used as a reference point in determining the separation flux of region 408.

In step 516 the differences between the profile points along the profile and the shank center value are summed together in order to produce a flux value termed the separation flux. Although the differences may be calculated in different ways, preferably, for each profile data point on intensity profile 120, the differences between each profile point and the shank center value are summed together to produce the separation flux. The resulting value from the sum of all these differences is a value in flux and is termed the separation flux as it is proportional to the distance between line 102 and feature 104. Thus, the result of step 516 is a separation flux value that indicates the flux of region 408.

In step 518 the separation area of that portion of region of interest 312 between lines 102 and 104 is determined by dividing the separation flux by the intensity range. Determination of the intensity range for profile 400 is a technique known to those of skill in the art and is also described in U.S. Pat. No. 5,966,677 referenced above.

In step 520 the separation distance 310 is determined by dividing the separation area by the region of interest height to yield a result in pixels. This separation distance 310 may then be used to determine whether bridging or line shorting might occur in the resultant wafer.

Line Displacement Measurement

Figure 12:
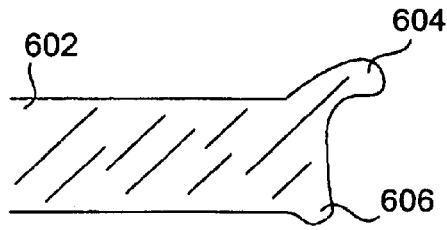
FIG. 12 illustrates a prior art line end.

FIG. 12 illustrates a prior art line end 602. As shown in the figure, the line end has asymmetrical serifs, i.e., serif 604 is larger then serif 606. As asymmetrical serifs can produce problems on a wafer, it is desirable to be able to measure such a line end to determine if the serifs are of different sizes. No known prior art techniques are able to consistently and accurately determine the asymmetry of such serifs at the smaller dimensions used on masks today. Such a technique would be desirable.

This embodiment of the present invention provides a technique for determining the asymmetry of serifs on a line end by measuring the line displacement. Preferably, line displacement is measured by comparing the centroid of the line at its shank with the centroid of the line at its end. Any displacement of the centroid can be expected to produce a corresponding displacement of the resultant line on the wafer. Displacement of the centroid is a measure of asymmetry of the serifs. This asymmetry could also be measured as an area difference or area ratio. The centroid displacement, however, is simply proportional to a visible affect on the wafer while the other two measures do not have simple relationships to affects on the wafer.

Figure 13:
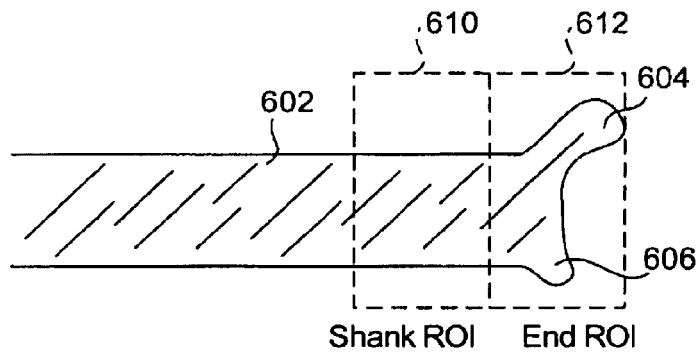
FIG. 13 illustrates measurement of the symmetry of line according to one embodiment of the invention.
Figure 14:
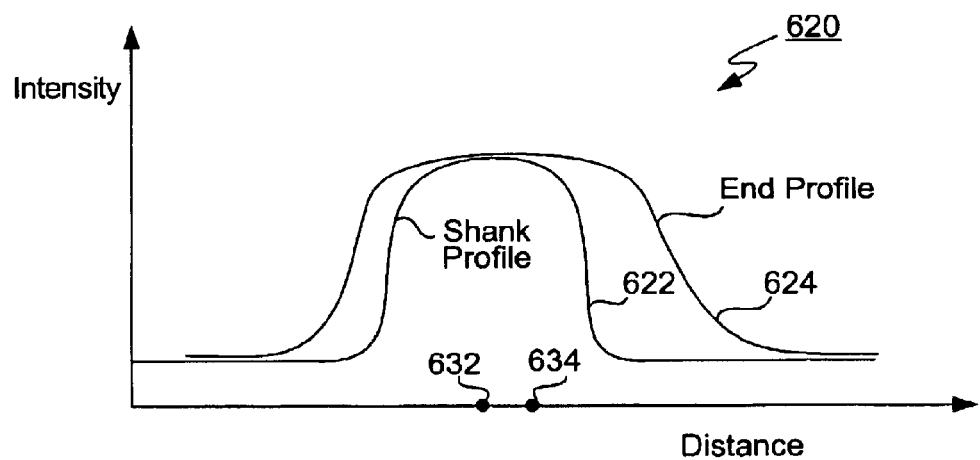
FIG. 14 is a graph showing an intensity profile for the shank of the line end and an intensity profile for the end of the line end.
Figure 15:
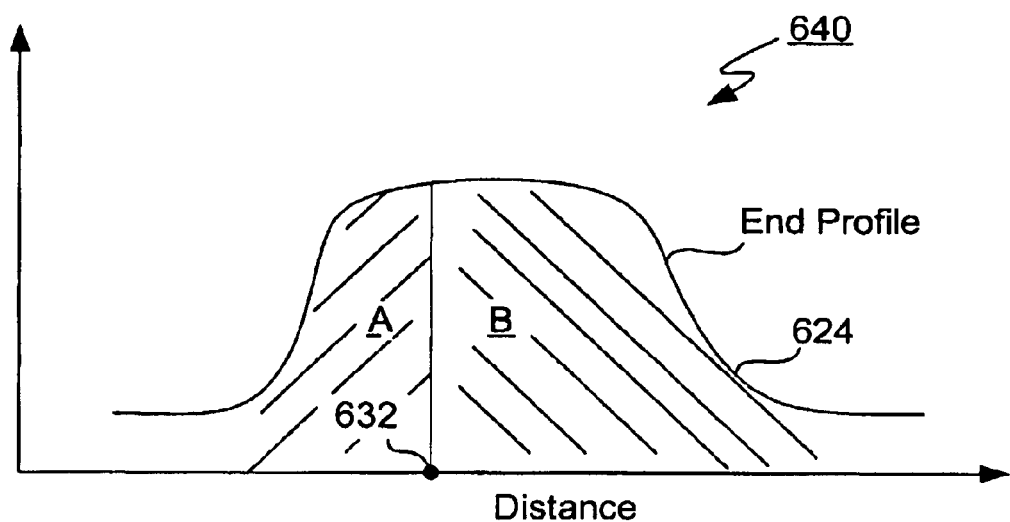
FIG. 15 is a graph showing the end profile having two areas A and B.

FIG. 13 illustrates measurement of the symmetry of line 602 according to one embodiment of the invention. Line 602 has a line end having serifs 604 and 606 which are asymmetrical. Regions of interest 610 and 612 are defined for line 602. FIG. 14 is a graph showing an intensity profile for the shank of the line end and an intensity profile for the end of the line end. FIG. 15 is a graph showing the end profile having two areas A and B.

Figure 16:
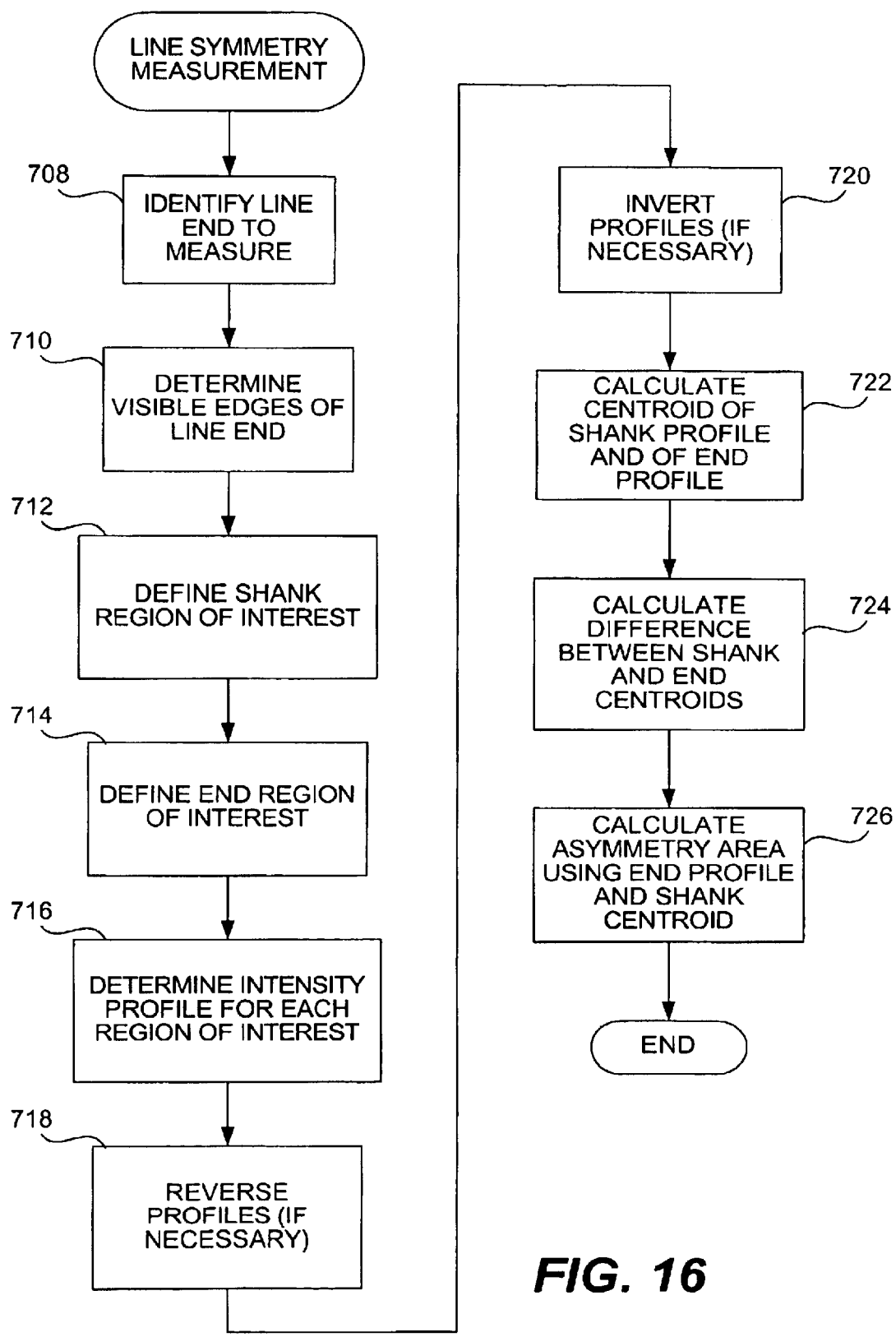
FIG. 16 is a flow diagram describing one embodiment for measuring the symmetry of a line end by determining line displacement.

FIG. 16 is a flow diagram describing one embodiment for measuring the symmetry of a line end by determining line displacement. In step 708 a line end to be measured is identified. Typically, this may be performed as is known in the art. An operator using a computer system selects a region of a photomask that includes a line end. Preferably, video inspection machine 832 is used to identify a particular region on a mask to be measured. In one embodiment, system 830 automatically identifies a line to be measured as part of the mask production process. In another embodiment, a line to be measured may be identified manually by the operator. Once a feature is identified the inspection machine enters review mode and the video image of the feature site may be displayed on the monitor of the computer.

In step 710 the visible edges of the line end are determined. Preferably, a technique such as blob analysis is used to find the three visible edges of the line end. The result of step 710 is a bounding box that tightly encompasses the line end to be measured. For example, FIG. 9 illustrates a bounding box 130 that is suitable for line 602.

Next, two different regions of interest are defined for the line end in order to facilitate measurement of the line displacement. In step 712 a shank region of interest 610 is defined around the shank of the line end, and in step 714 an end region of interest 612 is defined around the serifs at the line end. The two regions of interest may be of any suitable size. Preferable, each region of interest is approximately 2 lambda in width and their height may be approximately 0.7 lambda in each direction greater than a bounding box which bounds the line end (such as is shown in FIG. 9, for example).

Next, in step 716 an intensity profile is determined for each region of interest. Unlike previous embodiments in which columns of each region of interest were summed vertically to produce a profile, in step 716 an intensity profile is determined for each region of interest by summing rows of each region of interest horizontally. These profiles are shown in FIG. 14. Summed horizontally, shank ROI 610 produces shank profile 622, and end ROI 612 produces end profile 624. As to be expected profile 624 is wider then the other because the serifs of the line end distribute intensity across a greater distance when summed horizontally.

Although optional, it is preferable to manipulate the profiles (if needed) so that they have the same polarity and orientation such as shown in FIG. 14. Although not required, such orientation facilitates the below discussion and applies to line ends that appear in any direction either clear or opaque. For example, in step 718 the profile may be reversed. In step 720 the profile may be inverted; this step is used in a case where there is a chrome line on a clear mask.

In step 722 the centroid of the shank profile 632 and the centroid of the end profile 634 are calculated. Calculation of a centroid for a curve is a step known in the art. Due to the asymmetry of the serifs, it is expected that the centroids will be displaced slightly. In step 724 the difference is calculated between the two centroids yielding the line displacement. The line displacement value indicates asymmetry between the two serifs. Preferably calculation of line displacement yields a value in pixels. The line displacement will indicate the displacement of the corresponding line on the wafer. In some cases excessive line displacement could cause a malfunction in the wafer. In other cases excessive line displacement simply indicates that the mask is damaged.

To calculate asymmetry area, the following procedure is used. As shown in FIG. 15, the shank centroid 632 is located upon the x-axis for the graph of the end profile. Due to the asymmetry of the serifs, it is expected that the shank centroid will be offset from the center of the end profile. The area under the end profile curve is thus separated into two regions A and B. The area for each region is calculated and the asymmetry area is determined by subtracting the area for region B from the area for region A. The resulting asymmetry area corresponds to the difference in area between the two asymmetric serifs. This value may then be used to make a determination that the asymmetry is too large, that a serif is too large or too small, that there may be resulting problems on the wafer due to the asymmetry, etc.

Exemplary Hardware Embodiment

Figure 17:
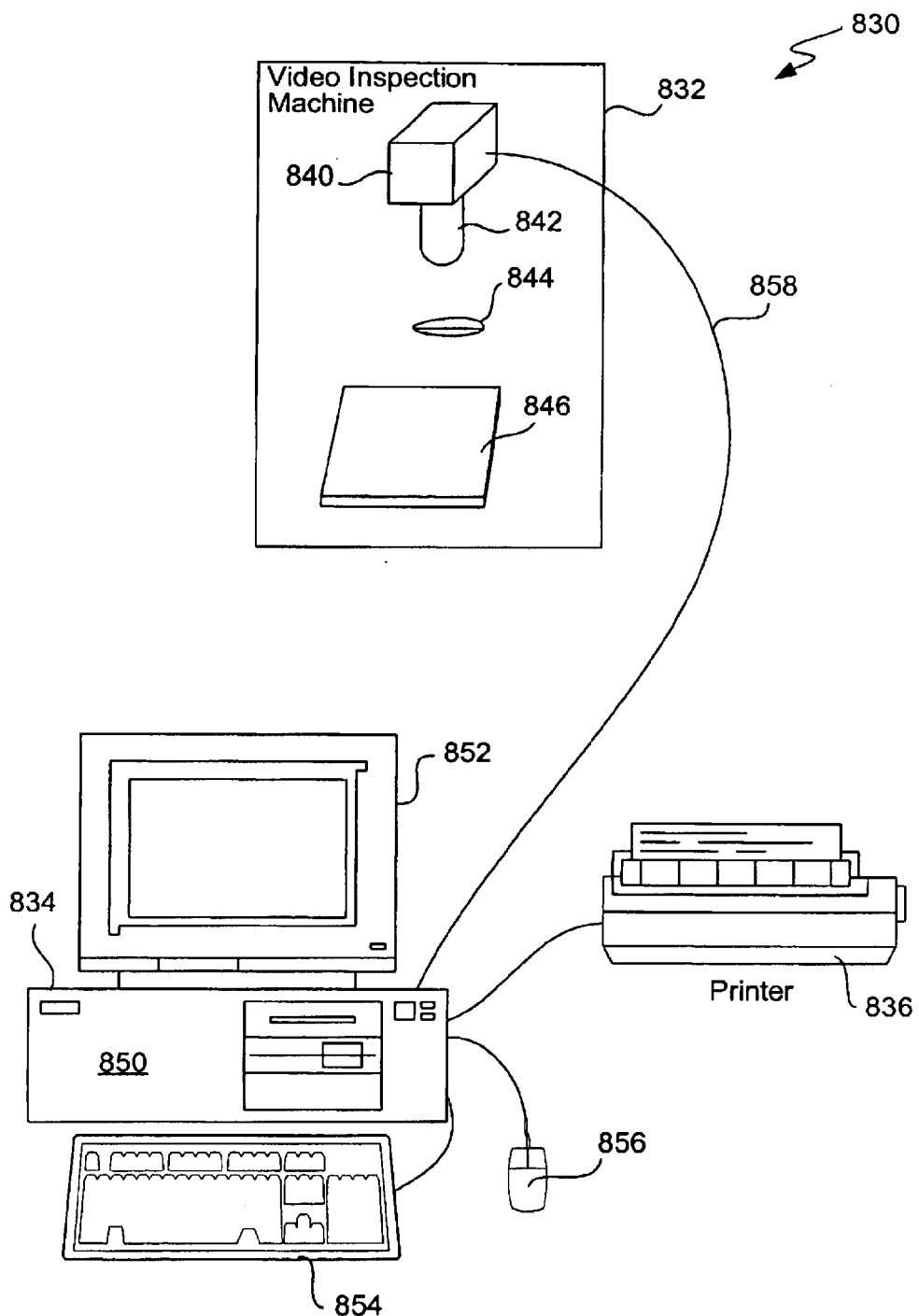
FIG. 17 illustrates a feature measurement system in accordance with one embodiment of the present invention.

FIG. 17 illustrates a feature measurement system 830 in accordance with one embodiment of the present invention. System 830 includes a video inspection machine 832, a computer system 834 and a printer 836. Video inspection machine 832 may be one of a wide variety of automatic inspection tools that analyze microscopic particles, lines, dimensions, etc., and outputs a video image of the microscopic features that it is analyzing. By way of example, machine 832 may be a KLA 2xx or 3xx automatic inspection tool used for inspecting photographic masks that are used in the manufacture of semiconductor devices. Other measurement systems such as KMS or LWM systems, or repair systems such as DRS-1 or DRS-2, or simple microscopes can be used. Although this technique is mostly used with transmission microscope images, it can be used in reflection, thus measuring features on opaque substrates such as silicon wafers.

Machine 832 includes a video camera 840 having a lens tube 842 and a lens 844 that is inspecting a medium 846. Medium 846 may be one of a wide variety of media having microscopic features that are suitable for measurement by the present invention. By way of example, medium 846 is a glass reticle having a chrome pattern upon it forming a mask used in semiconductor manufacturing. Also, a wide variety of other media may be suitable for use with present invention. For example, media such as silicon wafers, printed circuit boards, other transparent media, and other types of masks may have measurements performed upon them using any of the various techniques of the present invention. In one embodiment, a multi-camera option may be used in which two or more inspection machines of different types provide video data to the measurement tool. Each machine may use separate calibration data which is changed automatically when input is switched to originate from that machine.

Computer system 834 may be any suitable computer system for embodying the measurement tool of the present invention. By way of example, computer system 834 may be a "personal" computer having hardware 850, a high resolution monitor 852, a keyboard 854 and a mouse or track ball 856. Printer 836 is also connected to computer system 834 for allowing results of feature measurements to be printed.

Computer system 834 is connected to machine 832 via cable 858 which may be any suitable cable for transmitting raw video output data from machine 832 to computer system 834. In operation, machine 832 transmits via cable 858 multiplexed (in time or by position) feature image data and reference data to computer 834 for analysis and measurement. Reference data received from machine 832 is an image of what a particular portion of the mask should look like free of defects. This reference data may be retrieved from a mask database or may be obtained by doing a die-to-die comparison. Reference data can be used when a good quality profile is difficult to obtain. Thus, machine 832 transmits not only the results of measuring artificially-produced standard features for the purpose of producing calibration data, but also transmits live video images of actual features of unknown dimensions that are identified upon mask 846.

Figure 18:
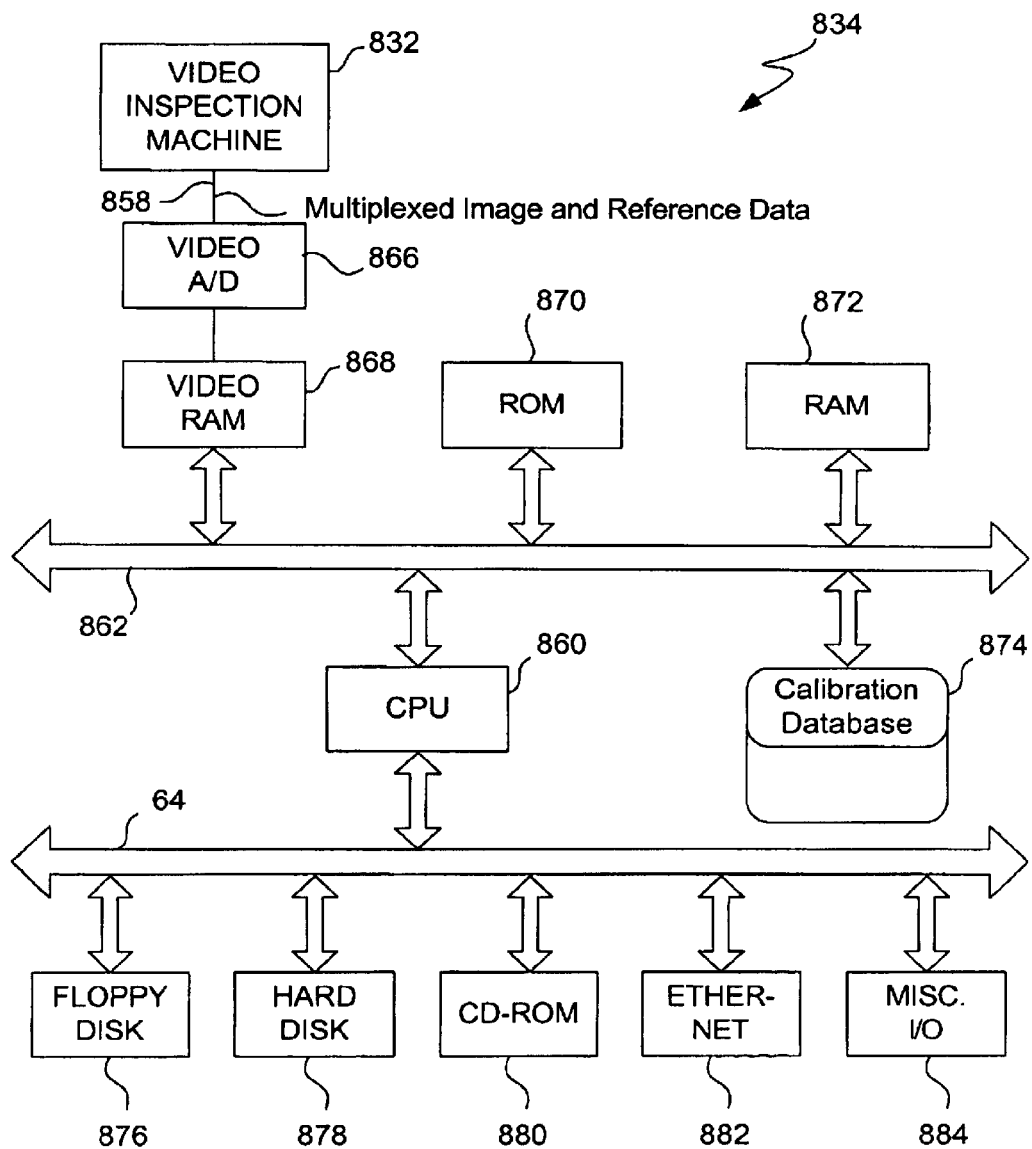
FIG. 18 illustrates in greater detail the computer system of FIG. 17.
Figure 19A:
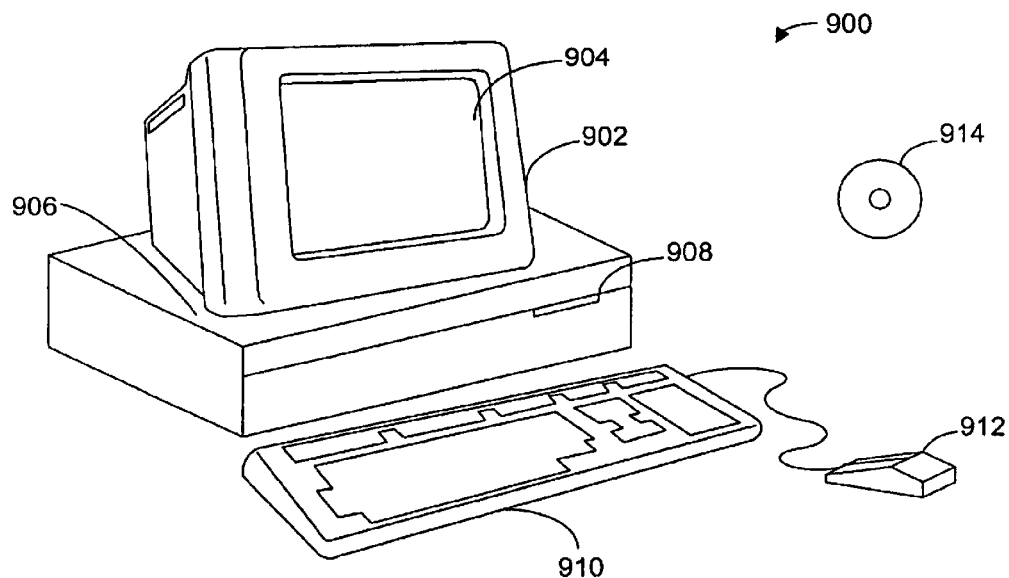
FIGS. 19A and 19B illustrate a computer system suitable for implementing embodiments of the present invention.
Figure 19B:
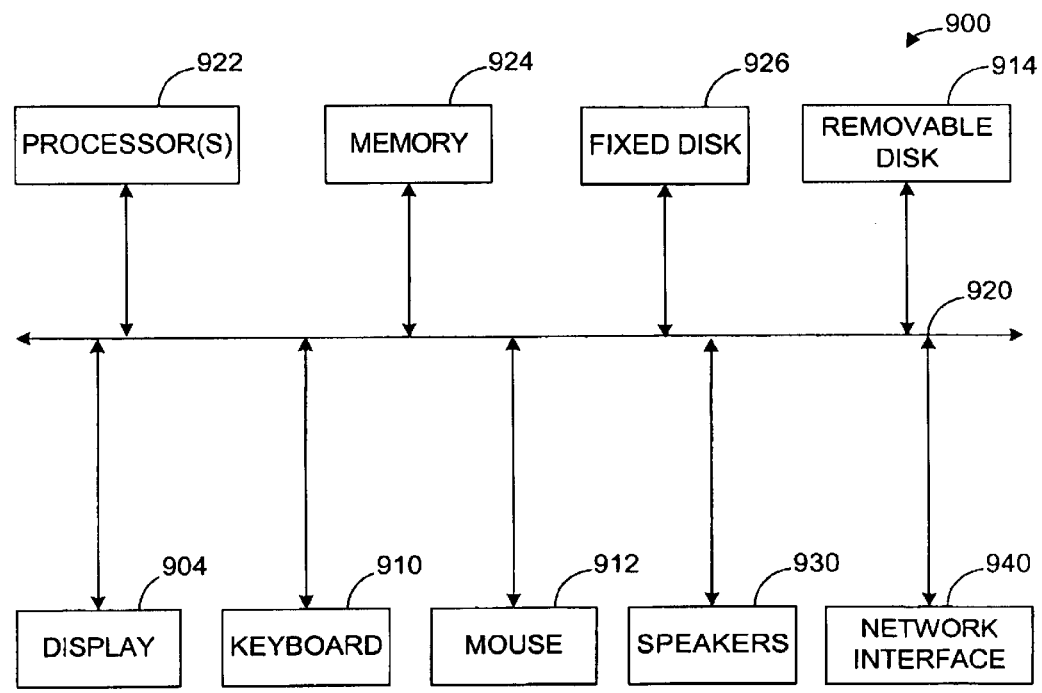

FIG. 18 illustrates in greater detail computer system 834 of FIG. 17. A wide variety of computer configurations may be used; one alternative embodiment for a computer system 834 is shown in FIGS. 19A and 19B. Hardware 850 includes a CPU 860 connected to a PCI bus 862 and also connected to any suitable computer bus 864. Video data from machine 832 travels over cable 858 to digitizer hardware 866 that converts the video analog signal to digital form. Hardware 866 is preferably high-resolution video capture hardware.

Once the video data has been converted to digital form by digitizer 866 the digital data is stored in video ram 868. Also connected to bus 862 is read-only memory (ROM) 870 and random access memory (RAM) 872. A calibration database 874 is also accessible via bus 862 and may be contained in any suitable memory of the computer. Calibration database 874 contains calibration data for machine 832. Connected to bus 864 are a wide variety of input and output devices. By way of example, shown are a floppy disk 876, a hard disk 878, a CD-ROM 880, a network connection 882 in the form of an Ethernet connection, and a wide variety of other miscellaneous input and output devices 884 that include printer 836, monitor 852, keyboard 854 and mouse 856.

Illumination and Inspection Embodiments

The present invention is useful in conjunction with a wide variety of lighting sources and/or particle microscopes (such as an electron microscope). Considering lighting sources first, it is known in the art to use transmitted illumination, bright field illumination (also called axial illumination), and dark field illumination (also called oblique illumination) to illuminate a medium. Other similar lighting techniques may also be used and the present invention can be used with any of these lighting techniques. In fact, certain inspection machines are able to employ more than one lighting technique simultaneously, thereby aiding the operator in identifying and sizing particles and features. Because a particular particle or feature may appear best under a certain type of lighting, it can be advantageous to employ more than one lighting technique.

As mentioned above, one lighting technique applicable for use with the present invention is transmitted illumination. Using this technique, light is transmitted through a medium under inspection in order to identify and size various types of features. The transmitted illumination technique is most useful for transparent media because the transparent media will not completely block all of the transmitted light. Media that are suitable for use with transmitted illumination include glass reticules, semiconductor masks, etc., and other transparent media and semi-transparent media. By using transmitted illumination, different features may appear dark or bright. Whereas a spot defect, a chrome line or other opaque substance would appear dark, a hole or absence of a portion of a chrome line on a glass reticule would appear bright because the transmitted light is allowed to pass through the transparent medium.

Another lighting technique is bright field illumination. Unlike transmitted illumination, bright field illumination uses a lighting source that is directed onto, and thus reflected from, the medium under analysis. In a typical setup, a light source is located perpendicular to the lens axis and the light is directed onto the medium axially by way of a reflecting mirror. A camera or other sensing device then picks up the light reflected from the medium. Bright field illumination is advantageous for an opaque surface such as a silicon wafer or other material. For completely or nearly opaque media, transmitted illumination would not be particularly useful because the light would not be transmitted; thus, bright field illumination that uses reflected light can be more advantageous. In addition, bright field illumination may be used with transparent media such as glass, a semiconductor mask or other because such a material, even though able to transmit light, will also reflect light. In general, any reflective medium is suitable for analysis using bright field illumination. In particular, bright field illumination is useful for identifying and sizing excess chrome, dirt or other particulate matter on silicon wafers, chrome surfaces, etc.

With bright field illumination flat surfaces appear bright because they reflect light, while a surface, particle or feature more or less not flat will appear dark because it does not allow light to be reflected back to a sensing device. For example, with bright field illumination spot defects, holes, chrome lines, line extensions, etc. will appear dark, while a flat surface or a missing portion of a chrome line would appear bright. In general, any feature of about less than one micron in size will appear dark because such a feature is close to the wavelength of light; the feature would not necessarily appear flat, and thus would appear dark.

Another lighting technique suitable for use with the present invention is dark field illumination. In dark field illumination a lighting source is typically located at an oblique angle from the medium under analysis. In a typical setup, a circular fluorescent light encircles the lens and medium under analysis and provides lighting from the side. As the lighting is from the side, the flat medium will appear dark because it does not necessarily reflect light directly into the lens. However, spot defects, holes, chrome lines, line extensions, etc. will often appear brighter than the dark background because their curved or rough shape allows a certain amount of light to be reflected back up into the lens. For example, a hole or other indent in a flat medium such as a silicon wafer may appear bright, whereas the flat wafer itself would appear dark.

The various embodiments of the inventions described herein are also suitable for use with a variety of particle microscopes such as an electron microscope or a focused ion beam (FIB) microscope. That is, the techniques of the present invention are applicable to measurements made with particles other than electrons. Although many references to light measurements are made herein, and many of the measurements and units are applicable to visible light, the invention is not so limited. References are made to visible light measurements for ease of presenting the invention. Therefore, references to "wavelength" refer to light wavelengths, electron wavelengths, or wavelengths of other particles used for measurement. For illustrative purposes, the present invention is described herein in connection with transmitted illumination, although the applicability of the invention is not so limited.

Computer System Embodiment

FIGS. 19A and 19B illustrate a computer system 900 suitable for implementing embodiments of the present invention. FIG. 19A shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 19B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bidirectional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the abovedescribed method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. For example, the video image input may come from a wide variety of sources. Also, measurements may be taken of a variety of features at the micron level that are present on a variety of media, and not necessarily a photographic mask. For example, the invention is applicable to biological specimens such as cells. Also, any type of light microscopic may be used as well as an electron microscope or other particle microscope. Therefore, the described embodiments should be taken as illustrative and not restrictive, and the invention should not be limited to the details given herein but should be defined by the following claims and their full scope of equivalents.

I claim:

1. A method of determining the relative area of a serif of a feature present on a photomask, said method comprising:
    identifying a feature having a serif;
    determining an intensity profile for a region of interest encompassing said feature with said serif;
    summing differences between data points on said profile and a constant value to calculate a flux value; and
    calculating a relative area of said serif from said flux value, whereby said relative area is useful for evaluating the quality of said photomask.

2. A method as recited in claim 1 wherein said feature is a line having a line end and said serif is present on said line end.

3. A method as recited in claim 2 wherein the width of said line is less than about twice the wavelength of the examining radiation.

4. A mask used in the manufacture of semiconductor devices, said mask resulting from a method of determining the relative area of a serif of a feature present on a photomask, wherein said method is as recited in any of claims 1 through 3.

5. A semiconductor device, said semiconductor device resulting from a method of determining the relative area of a serif of a feature present on a photomask, wherein said method is as recited in any of claims 1 through 3.

6. A method as recited in claim 1 wherein the radius of said serif is less than about twice the wavelength of the examining radiation.

7. A method of determining a separation distance between two features present on a photomask, said method comprising:
    defining a region of interest that spans the separation distance between said two features, a portion of each end of said region of interest being fully encompassed by one of said features;
    determining an intensity profile for said region of interest;
    summing differences between data points on said profile and a constant value to calculate a flux value; and
    calculating the separation distance between said features from said flux value, whereby said separation distance is useful for evaluating the quality of said photomask.

8. A method as recited in claim 7 wherein one of said features is a line end having serifs, said method further comprising:
    defining said region of interest such that said one end of said region is fully encompassed within said line end.

9. A method as recited in claim 8 wherein the separation distance is less than about twice the wavelength of the examining radiation.

10. A mask used in the manufacture of semiconductor devices, said mask resulting from a method of determining a separation distance between two features present on a photomask, wherein said method is as recited in any of claims 7 through 9.

11. A semiconductor device, said semiconductor device resulting from a method of determining a separation distance between two features present on a photomask, wherein said method is as recited in any of claims 7 through 9.

12. A method as recited in claim 7 wherein the radius of each of said two features is less than about twice the wavelength of the examining radiation.

13. A method of determining the asymmetry of serifs of a line present on a photomask, said method comprising:
    identifying a line having a line end with at least one serif;
    defining a shank region of interest that includes the shank of said line and an end region of interest that includes the end of said line;
    determining intensity profiles for both regions of interest, said shank and end profiles being determined by summing values in a longitudinal direction with respect to said line;
    calculating an asymmetry area value for said serifs using said end intensity profile and a centroid of said shank region of interest, whereby said asymmetry area is useful for evaluating the quality of said photomask.

14. A method as recited in claim 13 wherein the width of said line is less than about twice the wavelength of the examining radiation.

15. A mask used in the manufacture of semiconductor devices, said mask resulting from a method of determining the asymmetry of serifs of a line present on a photomask, wherein said method is as recited in any of claim 13 or 14.

16. A semiconductor device, said semiconductor device resulting from a method of determining the asymmetry of serifs of a line present on a photomask, wherein said method is as recited in any of claim 13 or 14.

17. A method as recited in claim 13 wherein the radius of each of said serifs is less than about twice the wavelength of the examining radiation.

* * * * *